United States Patent
Mathew et al.

(10) Patent No.: US 7,238,601 B2
(45) Date of Patent: Jul. 3, 2007

(54) SEMICONDUCTOR DEVICE HAVING CONDUCTIVE SPACERS IN SIDEWALL REGIONS AND METHOD FOR FORMING

(75) Inventors: Varughese Mathew, Austin, TX (US); Leo Mathew, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 230 days.

(21) Appl. No.: 10/939,148

(22) Filed: Sep. 10, 2004

(65) Prior Publication Data
US 2006/0057792 A1  Mar. 16, 2006

(51) Int. Cl.
*H01L 21/8234* (2006.01)
(52) U.S. Cl. ............... 438/596; 438/678; 438/682; 438/685; 438/686; 438/740; 257/E21.165
(58) Field of Classification Search ......... 438/304, 438/596
See application file for complete search history.

(56) References Cited

U.S. PATENT DOCUMENTS

| | | | |
|---|---|---|---|
| 5,652,160 A * | 7/1997 | Lin et al. ............... | 438/297 |
| 6,015,747 A | 1/2000 | Lopatin et al. | |
| 6,093,612 A * | 7/2000 | Suh ............... | 438/301 |
| 6,645,861 B2 * | 11/2003 | Cabral et al. ............ | 438/682 |
| 2003/0170969 A1 * | 9/2003 | Ishida et al. ............ | 438/596 |

OTHER PUBLICATIONS

U.S. Appl. No. 10/695,163, filed Oct. 28, 2003.

* cited by examiner

*Primary Examiner*—Stephen W. Smoot
(74) *Attorney, Agent, or Firm*—Joanna G. Chiu; Susan C. Hill (57) ABSTRACT

A conductive spacer (36, 122) in a sidewall region (30, 16) of a device (10, 100) is formed. The conductive spacer is formed adjacent sidewalls of the current electrode regions (18, 12). In one embodiment, a thin silicide layer (34) is formed at a top surface and a sidewall of the current electrode regions followed by an anisotropic etch of the conductive layer (32) used to form the thin silicide layer. The anisotropic etch of the conductive layer results in conductive spacers (36) adjacent sidewalls of the current electrode regions where these conductive spacers may allow for reduced contact resistance thus improving device performance. The conductive spacers may be formed adjacent current electrode regions of a MOSFET device, FINFET device, bipolar device, or Shotky-Barrier device.

20 Claims, 7 Drawing Sheets

SEMICONDUCTOR DEVICE HAVING CONDUCTIVE SPACERS IN SIDEWALL REGIONS AND METHOD FOR FORMING

RELATED APPLICATION

This is related to U.S. application Ser. No. 10/695,163 (issued as U.S. Pat. No. 6,951,783, entitled "Confined Spacers for Double Gate Transistor Semiconductor Fabrication Process," by Leo Mathew et al., filed on Oct. 28, 2003, and assigned to the current assignee hereof, and is herein incorporated by reference.

FIELD OF THE INVENTION

The present invention relates generally to semiconductor device processing, and more specifically, to semiconductor devices having conductive spacers in sidewall regions.

RELATED ART

In semiconductor processing, it is desirable to reduce contact resistance to current electrodes, such as the source and drain regions in metal-oxide-semiconductor field effect transistors (MOSFETS), in order to allow for better performance. One method used today for reducing contact resistance is to form a silicide region at the top surface of each of the source and drain regions, adjacent the spacers surrounding the gate. However, as the silicon layer in which the source and drain regions are formed becomes thinner, the silicide process becomes increasingly ineffective due, for example, to the formation of voids or the migration of oxide into the silicides which increases the contact resistance for the source and drain regions. For example, in semiconductor-on-insulator (SOI) devices, the silicon layer overlying the buried oxide and in which the devices (e.g. MOSFETS) are formed is thinner as compared to bulk semiconductor devices, which allows for improved device characteristics. However, the thin silicon layer in such SOI devices may prevent proper salicidation of the source and drain regions.

BRIEF DESCRIPTION OF THE DRAWINGS

The present invention is illustrated by way of example and not limited by the accompanying figures, in which like references indicate similar elements, and in which.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION OF THE DRAWINGS

As described above, thinner semiconductor layers typically allow for less effective salicidation of electrode regions, such as source and drain regions in a MOSFET, which may result in increased contact resistance. Therefore, one embodiment of the present invention forms a conductive spacer in a sidewall region of an SOI or FINFET device where the conductive spacer is formed adjacent sidewalls of the current electrode regions. In one embodiment, a thin silicide layer is formed at a top surface and a sidewall of the current electrode regions followed by an anisotropic etch of the conductive layer used to form the thin silicide layer. The anisotropic etch results in conductive spacers adjacent sidewalls of the current electrode regions where these conductive spacers may allow for reduced contact resistance thus improving device performance.

Figure 1:
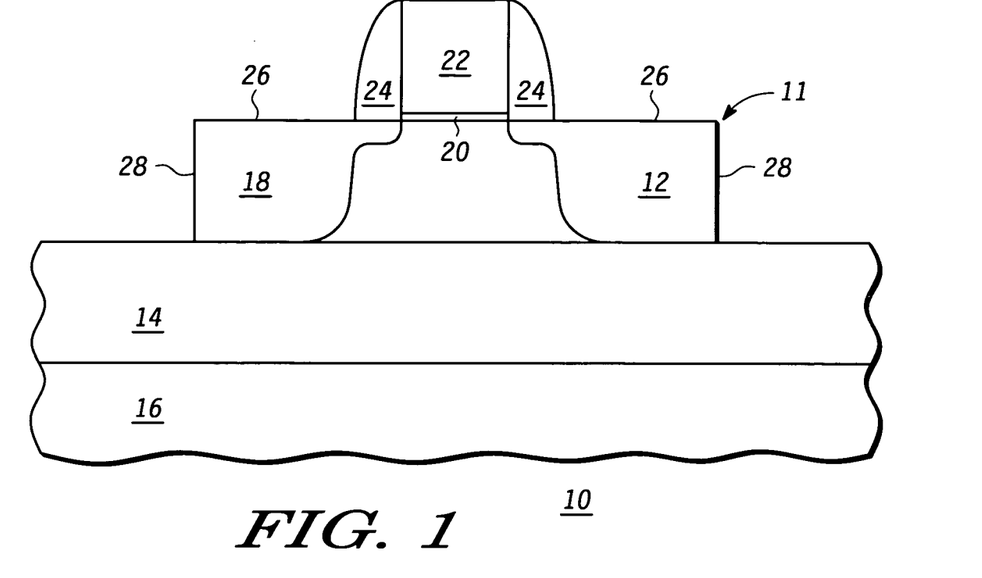
FIGS. 1-6 illustrate cross-sectional views of a process flow for forming an SOI device in accordance with one embodiment of the present invention.

FIG. 1 illustrates a device 10 in accordance with one embodiment of the present invention. In the illustrated embodiment, device 10 is an SOI MOSFET device including a substrate layer 16, a dielectric layer 14 overlying substrate layer 16, and a semiconductor layer 11 overlying dielectric layer 14. In one embodiment, substrate layer 16 is formed of any type of semiconductor material. Alternatively, substrate layer 16 may be formed of any type of material (semiconductor or non-semiconductor) which provides mechanical support for the overlying layers. In one embodiment, dielectric layer 14 is an oxide layer; however, in alternate embodiments, other dielectric materials or combinations of dielectric materials may be used such as, for example, nitride, sapphire, etc. In one embodiment, semiconductor layer 11 may be formed of any semiconductor material, such as, for example, silicon, germanium, silicon germanium, and gallium arsenide. (Note that in the descriptions that follow, semiconductor layer 11 will be assumed to be a silicon layer for ease of explanation.) Also, in the illustrated embodiment, semiconductor layer 11 is a thin semiconductor layer, having a thickness in a range of approximately 50 to 1000 Angstroms. In one embodiment, substrate layer 16, dielectric layer 14, and semiconductor layer 11 may be referred to collectively as an SOI substrate.

Device 10 includes current electrode regions 18 and 12 formed in semiconductor layer 11, a gate dielectric 20 overlying semiconductor layer 11, a gate 22 overlying gate dielectric 20, and spacers 24 adjacent sidewalls of gate 22. Note that the illustrated embodiment will be described as a MOSFET type device where current electrode regions 18 and 12 will be referred to as source/drain regions 18 and 12; however, note that in alternate embodiments, device 10 may be any type of device such as, for example, a bipolar device. In the illustrated embodiment, semiconductor layer 11 is patterned prior to the formation of source/drain regions 18 and 12, gate dielectric 20, gate 22, and spacers 24. Semiconductor layer 11 is patterned, as known in the art today, to form isolation regions between devices. These isolation regions are then filled with an insulating material, such as an oxide, to form isolation trenches between devices. However, in the embodiment of FIG. 1, these isolation regions are not filled with insulating material until later in the process (such as after FIG. 6).

Source/drain regions 18 and 22 each include extension regions which extend under spacers 24 and under a portion of gate dielectric 20. Formation of source/drain regions 18 and 22, spacers 24, gate dielectric 20, and gate 22 are well known in the art, and will not be described in detail herein. Note that the illustration of FIG. 1 provides just one example of source/drain regions 18 and 22, spacers 24, gate dielectric 20 and gate 22. For example, in an alternate embodiment, spacers 24 may include a spacer liner or may be formed of any number of layers. Similarly, gate 22 may be a polysilicon gate or a metal gate and may include any number of layers, as needed. Each of the source/drain regions 18 and 12 include a top surface 26 and a sidewall 28. (Note that sidewall 28 is formed due to the isolation regions between devices which have not yet been filled. However, if they are currently filled, then the fill material is removed to expose sidewalls 28.) Therefore, device 10 includes sidewall regions 30 which include sidewalls 28 and may also include exposed surface portions adjacent to sidewalls 28 (such as portions of 26 and of the top surface of dielectric layer 14).

Figure 2:
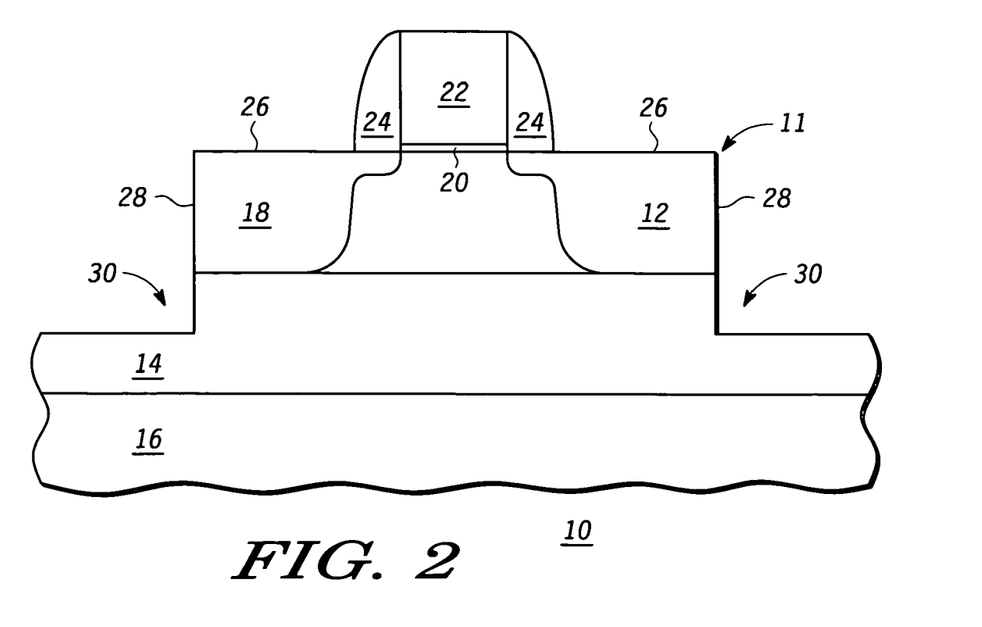

FIG. 2 illustrates device 10 after removing portions of dielectric layer 14 adjacent sidewalls 28 (in sidewall regions 30), such that sidewalls 28 are extended into dielectric layer 14 to include sidewalls of the source/drain regions and sidewalls of the dielectric layer. Therefore, note that sidewall 28 in sidewall region 30 has a first portion adjacent the current electrode region and a second portion adjacent the dielectric layer. Note that a portion of dielectric layer 14 remains overlying substrate 16 within sidewalls regions 30. That is, the entire depth of dielectric layer 14 is not removed. Conventional patterning and etching may be used to remove portions of dielectric layer 14 to extend sidewalls 28. Note that in an alternate embodiment, such as, for example, when semiconductor layer 11 is sufficiently thick (such as at least approximately 1000 Angstroms), then the etching into dielectric layer 14 to extend sidewalls 28 may not be necessary. In this embodiment, sidewalls 28 would include sidewalls of source/drain regions 12 and 18 but not of dielectric layer 14. Therefore, the etch of FIG. 2 to extend sidewalls 28 is optional. For example, this optional etch may be used when semiconductor layer 11 is thin (such as, for example, less than approximately 700 Angstroms). However, for ease of explanation, FIGS. 3-6 will be described in reference to using the optional etch to extend sidewalls 28.

Figure 3:
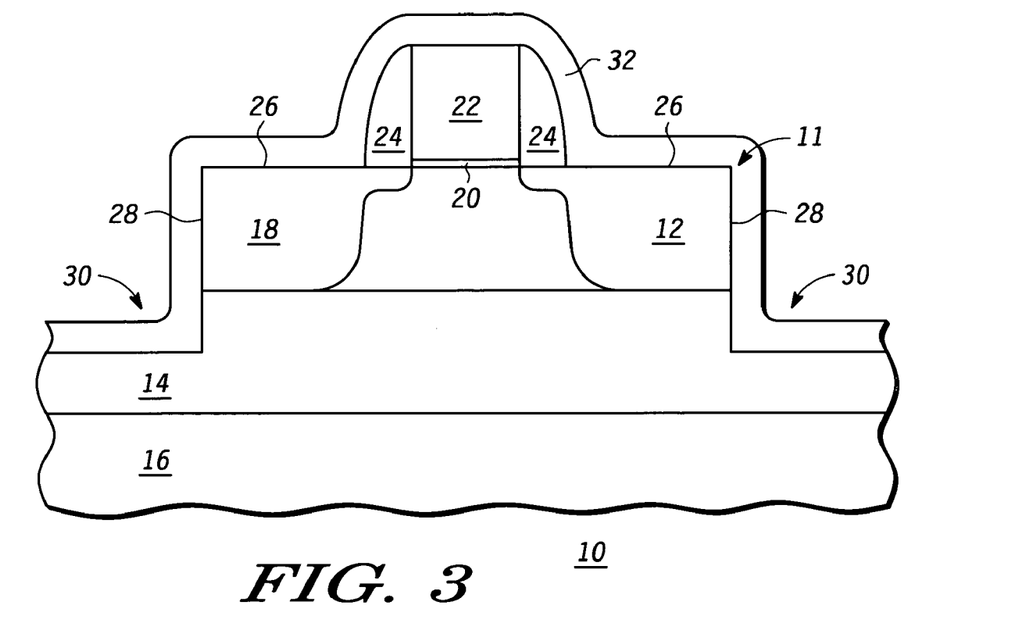

FIG. 3 illustrates the semiconductor device of FIG. 2 after formation of a conductive layer 32 overlying device 10. In one embodiment, conductive layer 32 includes a metal, such as, for example, cobalt, titanium, nickel, tantalum, tungsten, platinum, and palladium, ruthenium, and combinations thereof. Alternatively, conductive layer 32 may include a semiconductor material such as polysilicon or polysilicon germanium. For the descriptions herein, conductive layer 32 will be referred to as metal layer 32 where metal layer 32 includes a metal or combination of metals such as those listed above. In one embodiment, metal layer 32 is blanket deposited over dielectric layer 14, semiconductor layer 11, spacers 24, and gate 22 using known deposition techniques.

Figure 4:
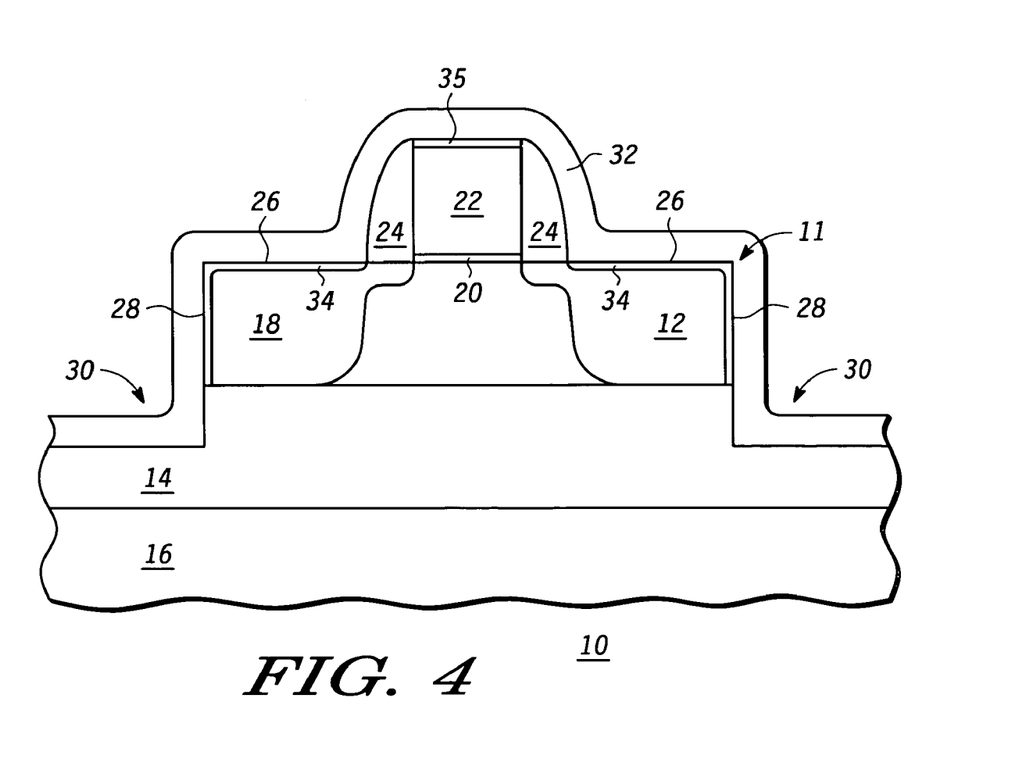

FIG. 4 illustrates semiconductor device of FIG. 3 after performing a salicide process to form thin silicide regions along the interfaces between semiconductor layer 11 and metal layer 32. During the salicide process, a portion of metal layer 32 is reacted with underlying semiconductor material (such as silicon) during a high temperature anneal process (at approximately 300-800 degrees Celsius). Therefore, silicide regions 34 (also referred to as silicide layers 34) are formed along sidewalls of source/drain regions 18 and 12, and along top surface 26 of source/drain regions 18 and 12. Silicide region 35 is formed along a top surface of gate 22 (at the interface of gate 22 and metal layer 32). In one embodiment, silicide regions 34 are thin, having a thickness of approximately 10 to 20 Angstroms. In an alternate embodiment, silicide regions 34 may be at most approximately 300 Angstroms. With the formation of thinner silicide regions, less semiconductor materials of semiconductor layer 11 is consumed. Therefore, the thickness of silicide regions 34 may depend on the thickness of semiconductor layer 11 where a thicker semiconductor layer 11 allows for thicker silicide regions as compared to a thinner semiconductor layer 11. Also, as will be described in reference to FIG. 5, silicide regions 34 provide an etch stop layer for subsequent etching. Note that in alternate embodiments, such as when semiconductor layer 11 is a germanium layer, other layers, such as a germanicide layer (or germanicide regions), rather than silicide layers or regions may be formed.

Figure 5:
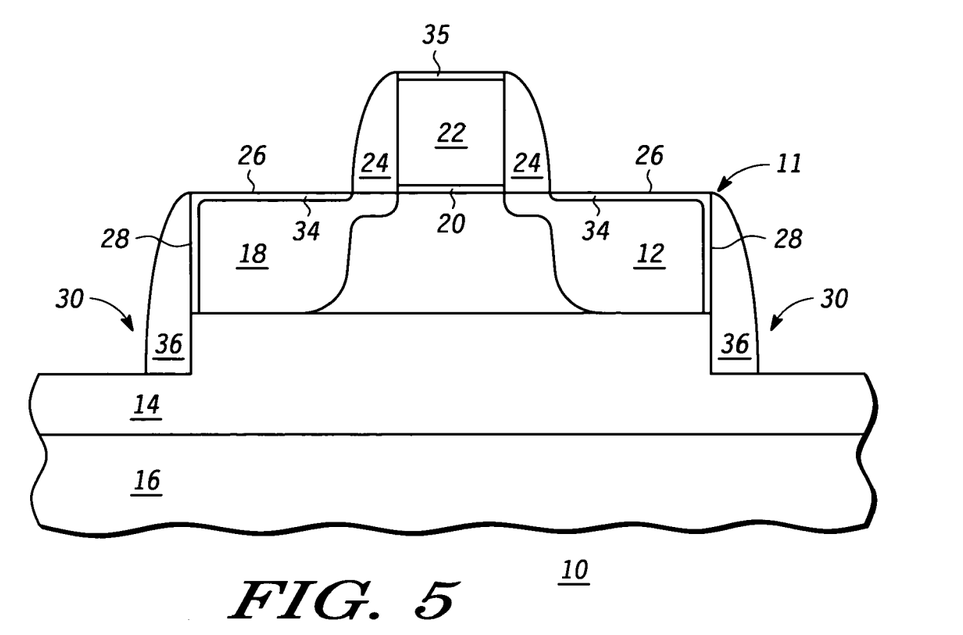

FIG. 5 illustrates semiconductor device 10 of FIG. 4 after removing portions of metal layer 32 to form metal spacers 36 adjacent sidewalls 28 in sidewalls regions 30. (Also, note that metal spacers 36 may also be referred to as conductive spacers 36.) In one embodiment, metal layer 32 is anisotropically etched using, for example, a dry etch such as a plasma or plasma-enhanced etch. The anisotropic etch removes metal layer 32 from the horizontal surfaces of device 10, leaving metals spacers along sidewalls 28. Note that the anisotropic etch may also leave metal portions (not shown) adjacent spacers 24. Note also that the portions of silicide regions 34 at surface 26 operate as an etch stop layer for the anisotropic etch. Alternatively, a timed etch may be used (such as, for example, in an embodiment where conductive layer 32 is a semiconductor material and thus no etch stop layer would be formed at surface 26). Therefore, in one embodiment, metal spacers 36 reduce contact resistance for source/drain regions 18 and 12 (via silicide regions 34), thus allowing for improved device performance while needing only thin silicide regions at the top surfaces of the source/drain regions which do not overly consume the semiconductor layer and which do not result in voids.

Figure 6:
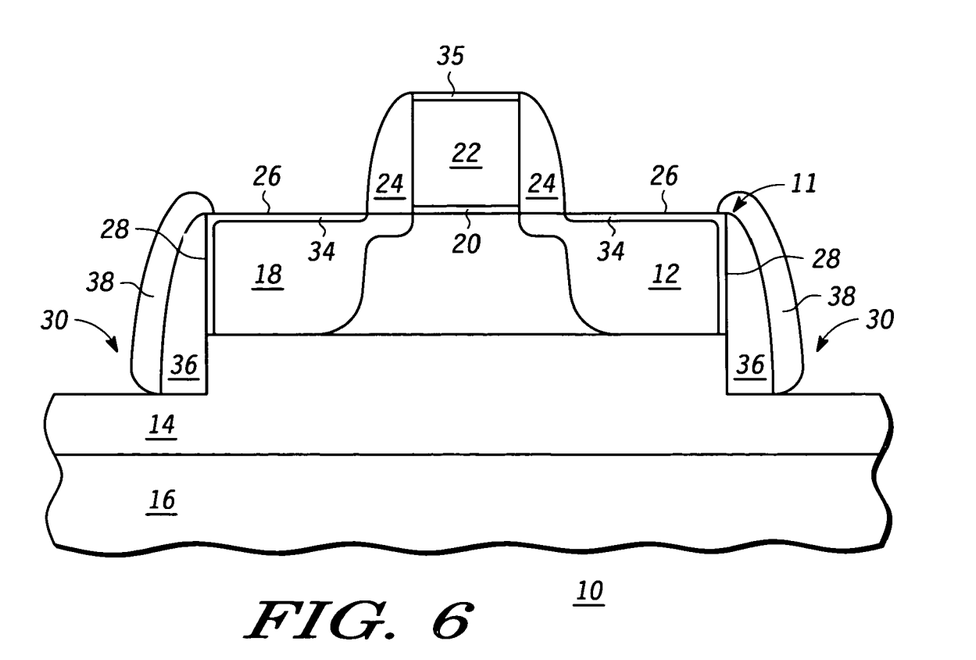

FIG. 6 illustrates semiconductor device 10 of FIG. 5 after selective metallization. A selective metallization process may optionally be performed after formation of metal spacers 36 to form metal portions 38 over metal spacers 36. Metal portions 38 may help further reduce contact resistance to source/drain regions 18. In one embodiment, metal spacers 36 may be used as a seed layer for electroless plating of metal to grow metal portions 38. Metal portions 38 may be formed of a same metal or combination of metals as metal spacers 36, or, alternatively, may include a different metal or combination of metals.

After the process of FIG. 6 (or FIG. 5 if the selective metallization is not performed), conventional processing may be performed to form a completed device. For example, isolation regions in which metal spacers 36 were formed may be filled with insulating materials, and contacts (conductive vias) may be formed to contact silicide regions 34 and 35 to provide for electrical connections to subsequent metal layers (not shown). Therefore, performance of device 10 may be improved because the contacts to silicide regions 34 and 35 will have reduced contact resistance due to metal spacers 36 (and metal portions 38, if present). In an alternate embodiment, note that device 10 may be formed using other substrates, such as a bulk semiconductor substrate rather than an SOI substrate. Note also that metal spacers 36 for the source/drain regions of a MOSFET described in reference to FIGS. 1-6 may also provide the basis for a Schotky-Barrier device. Also, as will be described below in reference to FIGS. 7-10, the metal spacers 36 described above may also be applied to FINET devices.

Figure 7:
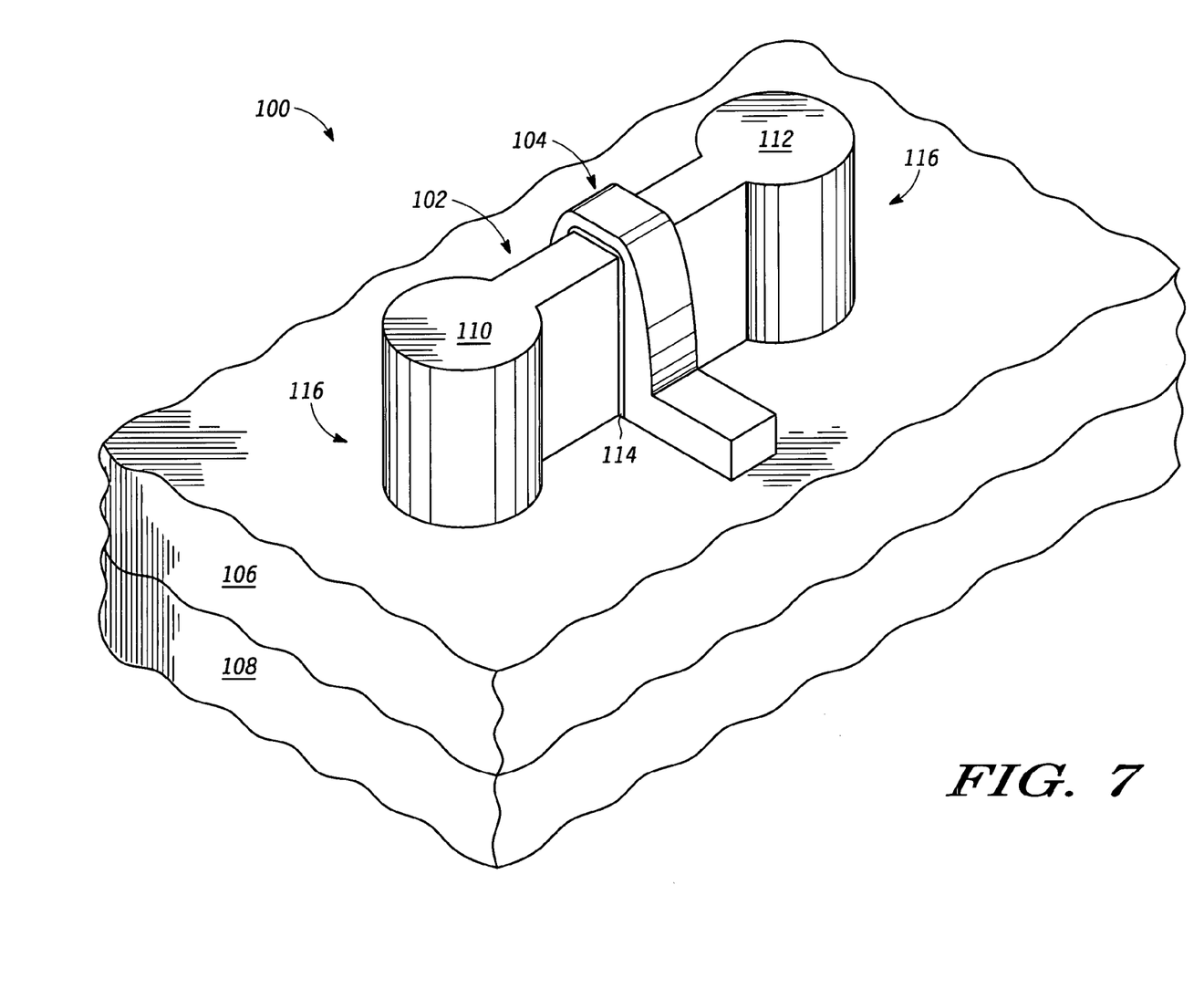
FIGS. 7-10 illustrate cross-sectional views of a process flow for forming a FIN field effect transistor (FINFET) device in accordance with an alternate embodiment of the present invention.

FIGS. 7-10 illustrate one embodiment in which conductive spacers (e.g. metal spacers) are formed in a FINFET device to, for example, reduce contact resistance. Note that in a FINFET device, a gate is wrapped around a thin vertical semiconductor layer, thus presenting many of the same problems present in thinner semiconductor layers described above. FIG. 7 illustrates one example of a FINFET device 100 having exposed sidewalls of the source/drain regions. Device 100 includes a substrate layer 108 and a dielectric layer 106 overlying substrate layer 108. The descriptions provided above for substrate layer 16 and dielectric layer 14 apply to substrate layer 108 and dielectric layer 106, respectively. Device 100 includes a fin 102 overlying dielectric layer 106, where fin 102 is formed of a semiconductor material, such as, for example, silicon, silicon germanium, germanium, gallium arsenide, etc. For ease of description herein, though, it will be assumed that fin 102 is formed of silicon.

Device 100 also includes a gate dielectric 114 and a gate 104 overlying a portion of fin 102. Gate 104 overlies a top portion of fin 102 and extends down each side of fin 102 and overlies dielectric layer 106, as illustrated in FIG. 7. That is, gate 104 wraps around the thinner portion of fin 102, where, in one embodiment, this thinner portion of fin 102 wrapped between legs of gate 104 has a width of at most approximately 20 nanometers. Note that gate dielectric 114 is formed between fin 102 and gate 104, where, in an alternate embodiment (not shown), gate dielectric 114 is not formed between fin 102 and gate 104 at a top surface of fin 102. Current electrodes 110 and 112 are formed in fin 102 on either side of gate 104, where current electrode 110 and 112 may be referred to as source/drain regions 110 and 112. Note that sidewalls of source/drain regions 110 and 112 of fin 102 not covered by gate 104 are exposed. In the illustrated embodiment, sidewall regions 116 include the sidewalls of source/drain regions 110 and 112 and may also include portions of adjacent surfaces. One method of forming device 100 as illustrated in FIG. 7 is described in U.S. patent application Ser. No. 10/695,163 (issued as U.S. Pat. No. 6,951,783, referenced above.

Figure 8:
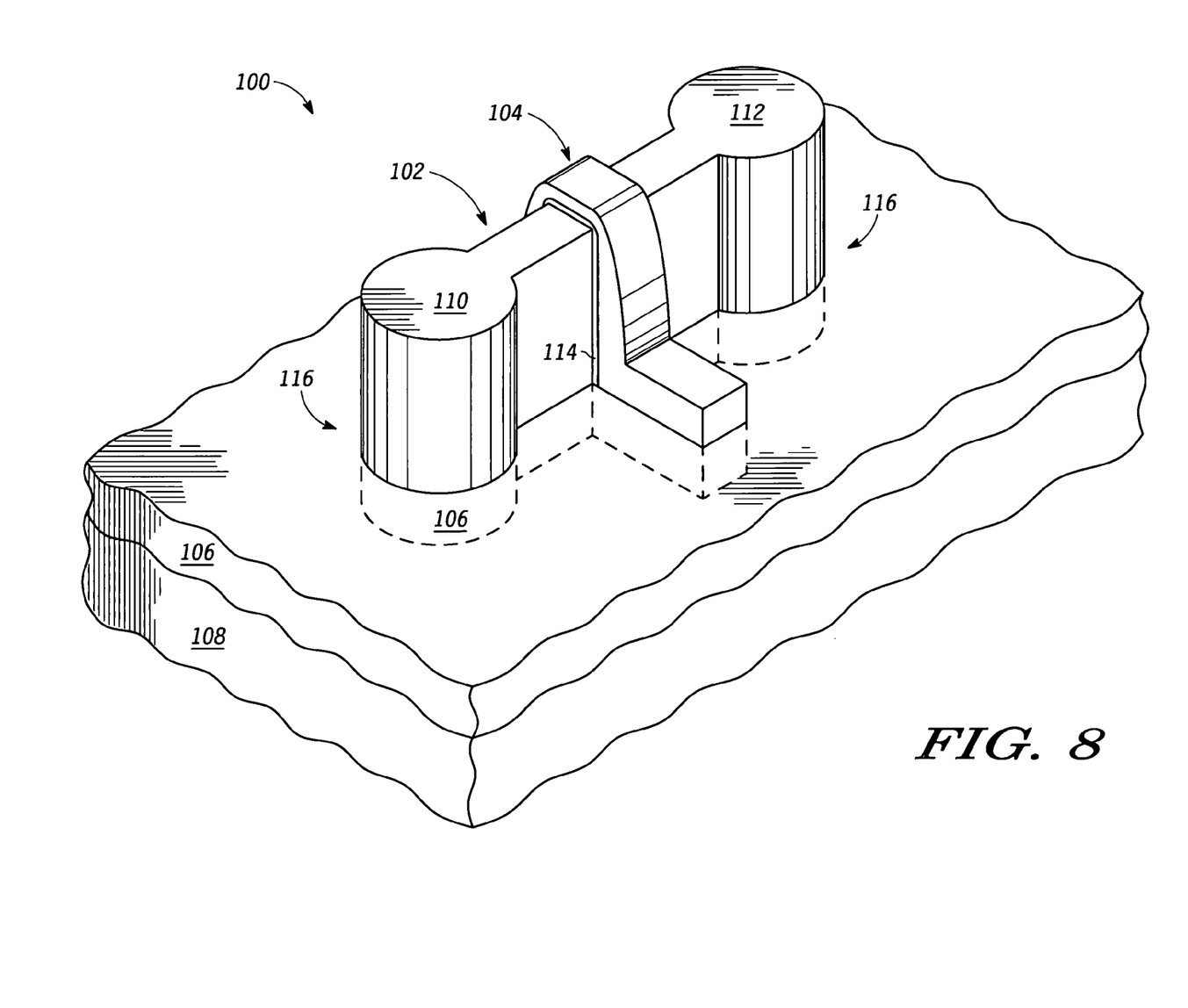

FIG. 8 illustrates device 100 after removing portions of dielectric layer 106 adjacent source/drain regions 110 and 112 to extend sidewall regions 116 to include sidewalls of source/drain regions 110 and 112 as well as sidewalls of dielectric layer 106 (where the sidewalls of dielectric layer 106 were exposed through the etching into dielectric layer 106). This is similar to the process illustrated in FIG. 2 above, and is also optional here for device 100.

Figure 9:
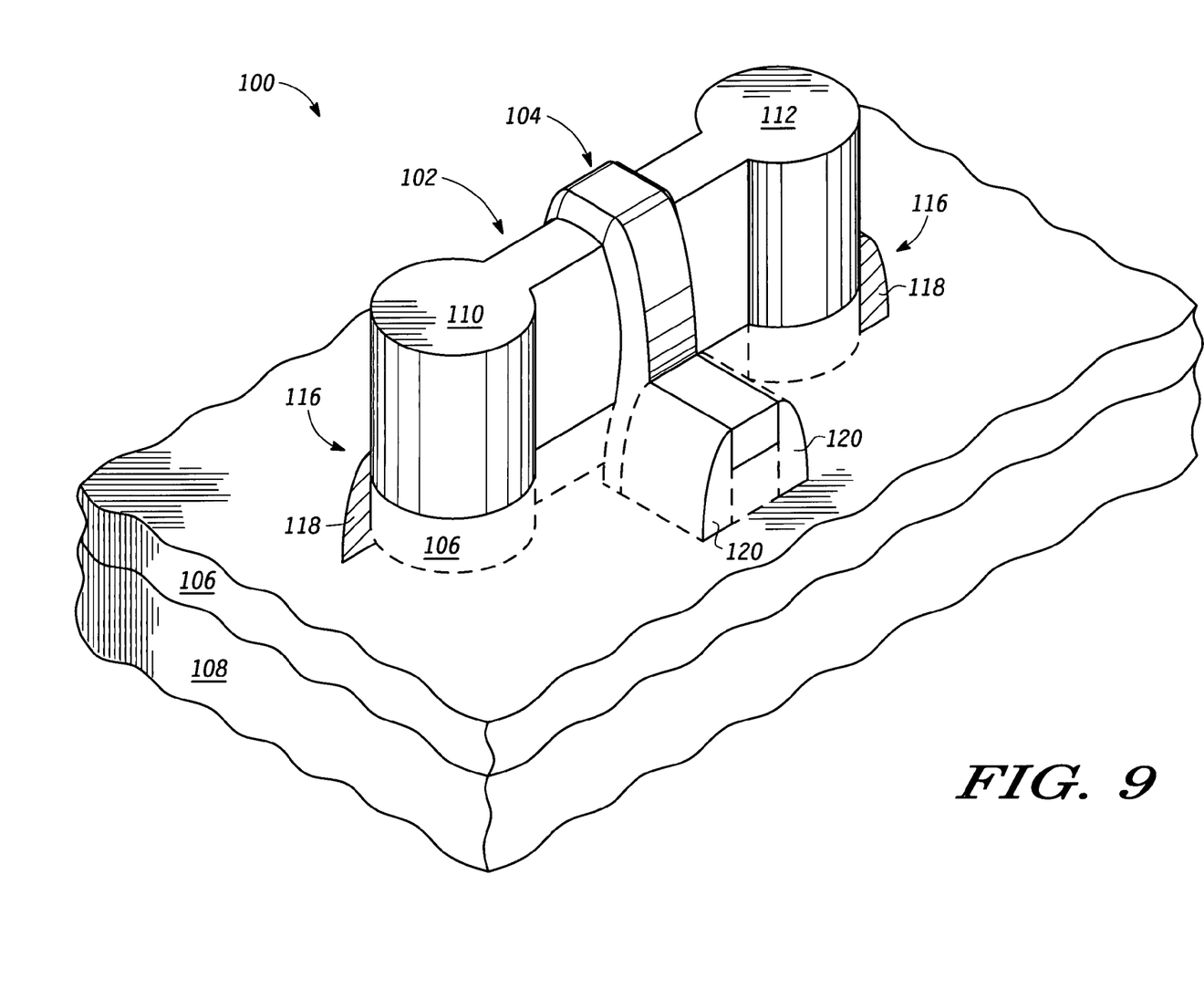

FIG. 9 illustrates device 100 after formation of spacers 120 adjacent gate 104, where, in one embodiment, spacers 120 are formed of nitride. In one embodiment, spacers 120 are formed by blanket depositing a dielectric layer (not shown) over device 120 and subsequently performing an anisotropic etch. In one embodiment, an overetch is performed to remove the spacer portions surrounding and overlying source/drain regions 110 and 112 of fin 102. In this manner, the sidewalls of source/drain regions 110 and 112 not underlying gate 104 remain exposed. Note that, after etching, portions 118 of the dielectric layer may also remain adjacent to the sidewalls of dielectric layer 106. These portions 118 may be removed; however, since these are adjacent sidewalls of dielectric layer 106, they need not be removed.

Figure 10:
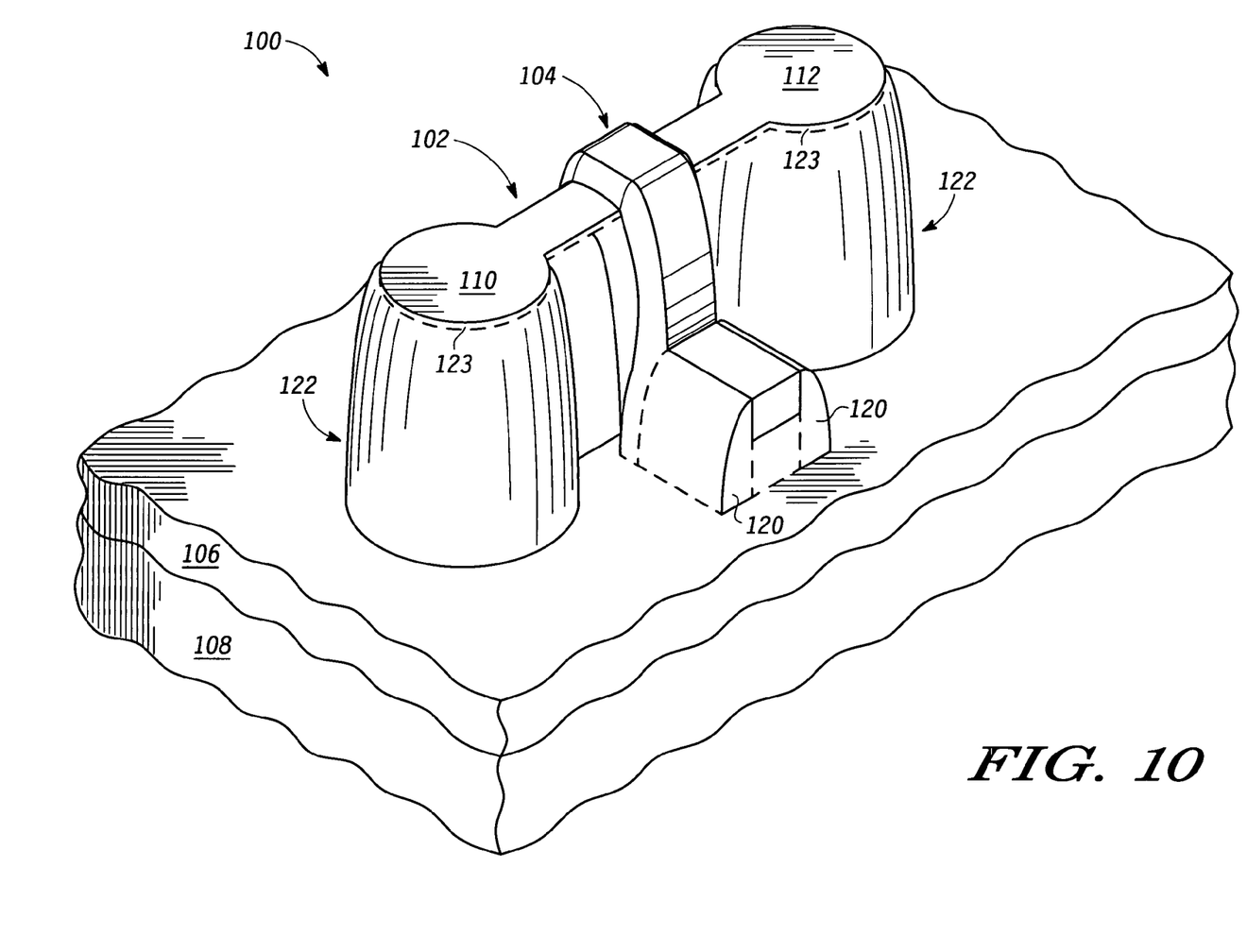

FIG. 10 illustrates device 100 after formation of a conductive layer overlying device 100 (not shown) and after salicidation and subsequent removal of portions of the conductive layer to form metal spacers 122. Similar to as described above in reference to FIGS. 3-5, a conductive layer (e.g. a metal layer) may be blanket deposited over device 100. A salicide process may then be performed to form a silicide regions 123 at the top surfaces of source/drain regions 110 and 112 (indicated by a dotted line in FIG. 10) and around the exposed sidewalls of source/drain regions 110 and 112. As described above in reference to FIG. 4, these silicide regions 123 may be thin, such as approximately 10-20 Angstroms, or alternatively, at most approximately 300 Angstroms, in order to prevent too much of fin 102 being consumed during the salicidation process. A subsequent anisotropic etch is then performed, thus resulting in metal spacers 122 adjacent the exposed sidewalls of source/drain regions 110 and 112 of fin 102.

Note that metal spacers 122 may be used as a seed layer to subsequently grow metal portions (similar to as described in FIG. 6), however, this is optional and may not be performed. Conventional processing may then be performed to form a completed device. Therefore, as with metal spacers 36, metal spacers 122 in FINFET device 100 may result in reduced contact resistance while allowing for the formation of thinner silicide regions, thus preventing many of the problems associated with saliciding thin silicon regions.

Therefore, it can be appreciated how the use of conductive spacers such as conductive spacers 36 and 122 may allow for improved devices by reducing contact resistance to the current electrodes of a device, such as a MOSFET device, FINFET device, bipolar device, Shotky-Barrier device, etc. Furthermore, the use of conductive spacers 36 and 122 allow for reduced contact resistance while preventing the problems associated with the formation of thicker silicide regions since thinner silicide regions may be formed instead.

Although the invention has been described with respect to specific conductivity types or polarity of potentials, skilled artisans appreciated that conductivity types and polarities of potentials may be reversed.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

The invention claimed is:

1. A process for forming a metal spacer in a sidewall region of a semiconductor device, comprising:
   forming the sidewall region adjacent to a current electrode region of the semiconductor device;
   forming, in the sidewall region, a metal layer over a substrate;
   reacting a portion of the metal layer to form an etch stop layer at an interface between the metal layer and the substrate;
   etching a portion of the metal layer; and
   using the etch stop layer as an etch stop during said step of etching in order to form a metal spacer in the sidewall region.

2. A process as in claim 1, wherein the etch stop layer comprises one selected from a group consisting of asilicide layer and a germanicide layer.

3. A process as in claim 1, wherein the current electrode region comprises a source/drain region.

4. A process as in claim 1, further comprising:
forming a second metal layer overlying the metal spacer.

5. A process as in claim 4, wherein said step of forming a second metal layer comprises:
using the metal spacer as a seed in an electroless plating process to grow the second metal layer.

6. A process as in claim 1, wherein the semiconductor device comprises a MOSFET.

7. A process as in claim 1, wherein the semiconductor device comprises a FINFET.

8. A process as in claim 1, wherein the substrate comprises a dielectric layer.

9. A process as in claim 8, further comprising:
before said step of forming the metal layer, etching the dielectric layer in the sidewall region.

10. A process as in claim 8, wherein a sidewall in the sidewall region has a first portion adjacent to the current electrode region and has a second portion adjacent to the dielectric layer.

11. A process as in claim 1, wherein the metal layer comprises one selected from a group consisting of a cobalt layer, a tungsten layer, a nickel layer, a palladium layer, a platinum layer, and a ruthenium layer.

12. A process for forming a conductive spacer in a sidewall region of a semiconductor device, comprising:
forming a current electrode of the semiconductor device in a substrate;
forming a sidewall adjacent to the current electrode of the semiconductor device;
forming a conductive layer overlying the substrate and adjacent to the sidewall;
reacting a portion of the conductive layer to form an etch stop layer at an interface between the conductive layer and the substrate;
etching a portion of the conductive layer; and
using the etch stop layer as an etch stop during said step of etching in order to form a conductive spacer adjacent to the sidewall.

13. A process as in claim 12, wherein the etch stop layer comprises one selected from a group consisting of a suicide layer and a germanicide layer.

14. A process as in claim 12, wherein the conductive layer comprises a first metal layer, the process further comprising:
forming a second metal layer overlying the conductive spacer.

15. A process as in claim 14, wherein said step of forming a second metal layer comprises:
using the conductive spacer as a seed in an electroless plating process to grow the second metal layer.

16. A process as in claim 12, wherein the semiconductor device is a FINFET.

17. A process as in claim 12, wherein the substrate comprises a dielectric layer, the process further comprising:
before said step of forming the conductive layer, etching the dielectric layer.

18. A process as in claim 17, wherein the sidewall has a first portion adjacent to the current electrode and has a second portion adjacent to the dielectric layer.

19. A process as in claim 12, wherein the conductive layer comprises one selected from a group consisting of a cobalt layer, a tungsten layer, a nickel layer, a palladium layer, a platinum layer, and a ruthenium layer.

20. A process for forming a metal spacer in a sidewall region of a semiconductor device, comprising:
providing a substrate having a dielectric layer;
forming a current electrode region of the semiconductor device overlying the substrate;
etching the dielectric layer to form a sidewall having a first portion adjacent to the current electrode region and having a second portion adjacent to the dielectric layer;
forming a metal layer overlying the substrate and adjacent to the sidewall;
reacting a portion of the metal layer to form an etch stop layer at an interface between the metal layer and the substrate;
etching a portion of the metal layer; and
using the etch stop layer as an etch stop during said step of etching in order to form a metal spacer adjacent to the sidewall.

* * * * *

UNITED STATES PATENT AND TRADEMARK OFFICE
CERTIFICATE OF CORRECTION

| | |
|---|---|
| PATENT NO. | : 7,238,601 B2 |
| APPLICATION NO. | : 10/939148 |
| DATED | : July 3, 2007 |
| INVENTOR(S) | : Varughese Mathew et al. |

It is certified that error appears in the above-identified patent and that said Letters Patent is hereby corrected as shown below:

Column 6, Line 65, Claim No. 2:

Change "consisting of asilicide" to --consisting of a silicide--

Signed and Sealed this

Seventeenth Day of June, 2008

JON W. DUDAS
*Director of the United States Patent and Trademark Office*